HIGH CURRENT GAIN AND UNITY VOLTAGE GAIN POWER AMPLIFIER

Filed Sept. 24, 1962

INVENTOR
WILLIAM ALBERT HARRISON
RICHARD W. BRADMILLER
BY Michael A. Sileo, Jr.
ATTORNEY

HIGH CURRENT GAIN AND UNITY VOLTAGE GAIN POWER AMPLIFIER

Filed Sept. 24, 1962

INVENTOR
WILLIAM ALBERT HARRISON
RICHARD W. BRADMILLER

BY Michael A. Sileo, Jr.
ATTORNEY 3,268,826
Patented August 23, 1966

3,268,826

HIGH CURRENT GAIN AND UNITY VOLTAGE GAIN POWER AMPLIFIER

William Albert Harrison, Orlando, and Richard W. Bradmiller, Winter Park, Fla., assignors to Martin-Marietta Corporation, Middle River, Md., a corporation of Maryland Filed Sept. 24, 1962, Ser. No. 225,812
19 Claims. (Cl. 330—13)

This invention relates to power amplifiers and more particularly to a multistage power amplifier utilizing a complementary symmetry arrangement of solid state devices. Briefly, this invention pertains to a unity voltage gain, high current gain, multistage, dual channel power amplifier of the transformerless direct coupled type which uniquely utilizes opposite conductivity type solid state devices connected in complementary symmetry for providing high stability, low distortion, low dynamic output impedance, wide frequency range and a high power output.

The prior art is replete with solid state power amplifier circuits having dual signal paths or channels for push-pull operation. In practical application of circuits of this type, high stability, low distortion, low dynamic output impedances, wide frequency range and relatively high power output are highly desirable and necessary features. Push-pull operation of these prior known power amplifier circuits have provided a reasonable reduction of undesirable signal distortion over a fairly wide frequency range of operation. In addition, the exclusion of transformer or inductive input and output coupling arrangements in these prior art amplifier circuits have materially improved quality of performance and substantially reduced cost of manufacture. Further, class B operation of the prior known power amplifier circuits have generally permitted high power output at a reasonable cost. Heretofore, however, the foregoing circuit procedures for achieving the above stated desirable features have been achieved only by the use of highly expensive components and by circuits of an extremely high degree of complexity.

Skilled artisans in the semiconductor art while continually attempting to achieve the aforementioned desirable features for high current gain power amplifiers have at the same time meticulously attempted to materially reduce circuit complexity, size and weight as well as the cost of manufacture.

One prior known power amplifier circuit utilizes a pair of semiconductor devices, such as transistors, of like conductivity type connected in a push-pull power amplifier output stage and arranged in parallel relation for supplying signal currents to a load. This circuit is commonly referred to as a push-pull single-ended circuit. A pair of semiconductor devices of opposite conductivity are then connected in driving relationship with the push-pull single ended circuit for providing out-of-phase driving signals in response to the single-ended input signal.

Other early attempts to achieve the foregoing ideal power amplifier features, suggested the use of tandem connected complementary type semiconductor devices in power amplifier circuits. One attempt suggested the utilization of a push-pull circuit configuration adapted for excitation from a single signal source. It was also discovered at that time that when negative current feedback was employed in such amplifier configurations, objectionable distortion ensues in most ranges of power output.

In all the prior known attempts to achieve the acme of semiconductor power amplifier circuitry, it was overwhelmingly determined that complex circuitry or costly components were necessary.

In addition to the above problems, it was further discovered that dual channel semiconductor power amplifier circuits invariably required extensive adjustment upon breakdown substitution of semiconductors in order to provide stability of operation. This is so since the prior known circuits required identical semiconductor characteristics, both statically and dynamically, for the semiconductors in each signal path or channel. Thus, since the characteristics of manufactured semiconductor devices vary within wide limits, a circuit which had been adjusted for one set of semiconductors for satisfactory operation generally operated unsatisfactorily with a substituted set of semiconductors. Further, since circuits of this general nature have parallel signal paths there existed a required symmetry of operation between the two signal paths. Therefore, any characteristic differences between semiconductors in one signal path and semiconductors in another signal path undesirably resulted in unstable operation and signal distortion.

The above-mentioned problems and undesirable features are uniquely overcome by the high current gain and unity voltage gain multistage power amplifier of the present invention.

In one exemplary embodiment of the present invention, a phase splitter having two output circuits is provided with an input circuit for simultaneously delivering a signal to the phase splitter. Identical parallel connected signal paths or channels each comprising in chain connected or cascaded arrangement, a direct coupled D.C. setter, a direct coupled driver and a direct coupled amplifier, are respectively connected to the output circuits of the phase splitter. For purposes of this disclosure a direct coupled D.C. setter is an amplifier circuit for establishing the proper phase and voltage level of the signal being amplified and transferred and a direct coupled driver is a circuit for amplifying signal currents and applying the amplified signals to an adjacent direct coupled amplifier circuit. A 100% closed loop negative current feedback circuit is then connected between the output circuits of the parallel channels and the phase splitter. A 100% negative current feedback can be utilized in this circuitry since the stages in each parallel path are directly connected and when this high degree of negative current feedback is employed, signal path balancing problems, biasing problems, and interchangeability discrepancies inherent in the prior known power amplifier circuits can be reduced to a practical minimum. It is to be understood, of course, that the feedback loop may incorporate any of the well known impedance devices for the purpose of providing any desired phase, amplitude, input, output and loading characteristics. Finally, a load impedance is connected in common across the output circuits of the parallel channels for providing a so called push-push circuit configuration. Thus, one of the parallel channels couples a first portion of the input signal to the load impedance and the other parallel channels couples a second portion of the input signal to the load impedance. The foregoing embodiment of the present invention may utilize solid state devices with several of such devices connected in complementary symmetry. Also, the solid state devices may be forward biased so that slight residual currents may flow through the devices when no voltage signal input is being applied to the phase splitter. It has been discovered that this forward biasing expedient additionally reduces distortion, particularly cross-over distortion. In addition, compensating resistors and diodes may be incorporated under certain circuit conditions for further improving static balance in the multistage power amplifier and for further controlling static bias by providing D.C. clamping action on each stage of the multistage power amplifier.

Another exemplary embodiment of the present invention provides a high current gain and unity voltage gain, multistage power amplifier having a first pair of complementary solid state devices connected in complementary symmetry arrangement with the input signal being simultaneously applied to the inputs of the devices. A second pair of complementary solid state devices are respectively connected to the first pair of devices, with the devices in the second pair being of opposite conductivity to the devices in the first pair to which they are connected. Also provided are two signal paths or channels each having at least one solid state device with each device in the channels being of the same conductivity. Each of the channels have their input circuits respectively connected to the output circuits of the second pair of devices and have their output circuits connected in common. A load impedance is series connected to the common junction of the output circuits of the channels of solid state devices. A. D.C. power source is provided for operatively biasing all the solid state devices of the power amplifier. As mentioned above with regard to the first embodiment of this invention, the solid state devices of the power amplifier may be forward biased. This forward biasing feature may be achieved by coupling the output electrodes of the solid state devices to the D.C. source of potential through compensating resistive means.

It is accordingly a primary object of the present invention to provide a novel high current gain power amplifier which effectively utilizes a complementary symmetry arrangement of solid state devices.

It is another object of the present invention to provide a novel unity voltage and high current gain power amplifier having substantially zero phase shift which amplifier effectively utilizes a complementary symmetry arrangement of solid state devices for driving output stages having solid state devices of similar conductivity.

It is another object of the present invention to provide a novel unity voltage and high current gain, multistage, dual channel, power amplifier of the transformerless direct coupled type which effectively utilizes opposite conductivity type solid state devices in complementary symmetry connection.

It is still another object of the present invention to provide a power amplifier of the type described which provides high stability, low distortion, low dynamic output impedance, wide frequency range and high power output.

It is yet still another object of the present invention to provide a power amplifier of the type described which effectively utilizes at least two parallel connected multistage chains of cascaded solid state devices.

It is a further object of the present invention to provide a novel power amplifier of the type described which effectively eliminates the requirement for transformer or inductive input and output coupling circuits and which uniquely permits push-push signal current amplification so as to provide high power output.

It is still a further object of the present invention to provide a novel power amplifier of the type described wherein forward biasing may be utilized so that a slight residual current flows through all the solid state devices of the power amplifier when no input signal is applied so as to greatly reduce signal distortion, improve static balance and control static bias.

It is yet still a further object to provide a unique power amplifier of the type described wherein the solid state devices of the power amplifier are forward biased through non-linear compensating resistive means for improving static balance and for controlling static bias by providing a D.C. clamping action in each stage of the power amplifier.

It is an additional object of the present invention to provide a novel power amplifier of the type described which uniquely utilizes 100% negative current feedback thereby eliminating the necessity of signal channel balancing and permitting the use of solid state devices having a wide variety of static and dynamic characteristics.

These and further objects and advantages of the present invention will become more apparent upon reference to the following description and claims and the appended drawings wherein:

Figure 1:
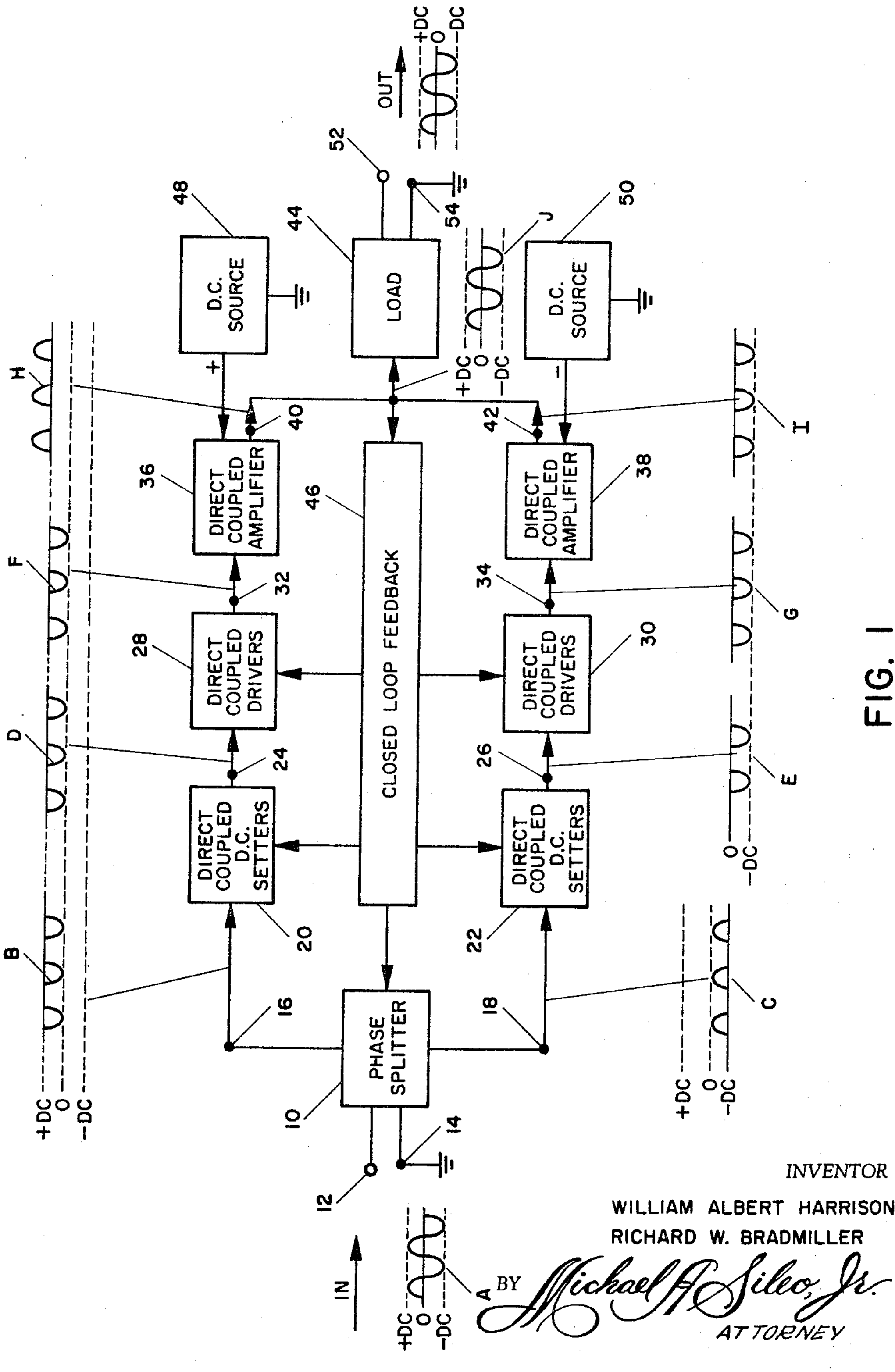
FIGURE 1 is a block diagram of the high current gain power amplifier of the present invention.
Figure 2:
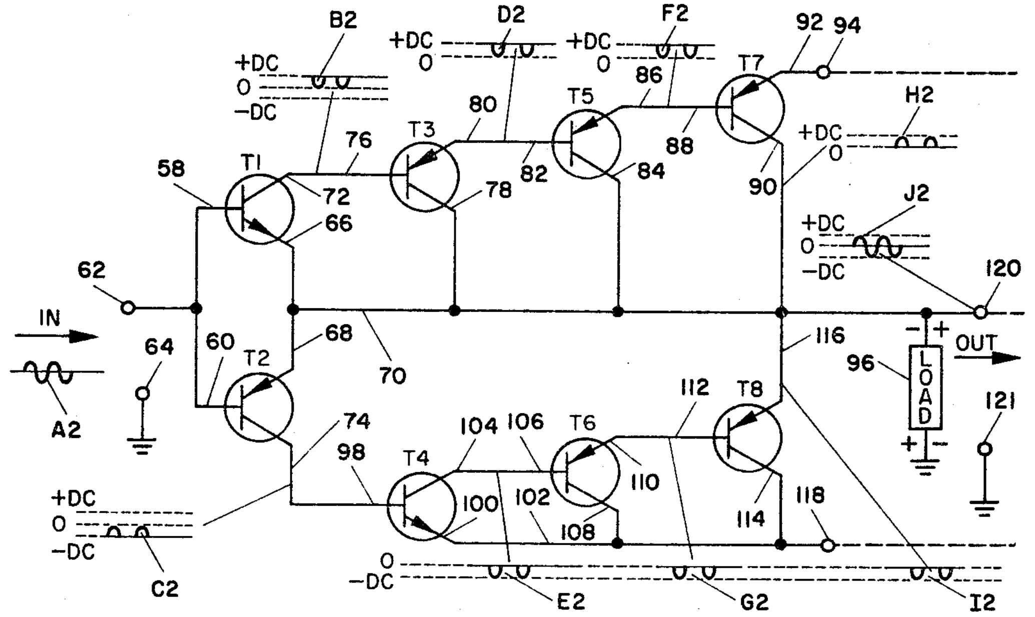
FIGURE 2 is a circuit diagram of the high current gain power amplifier of the present invention.
Figure 3:
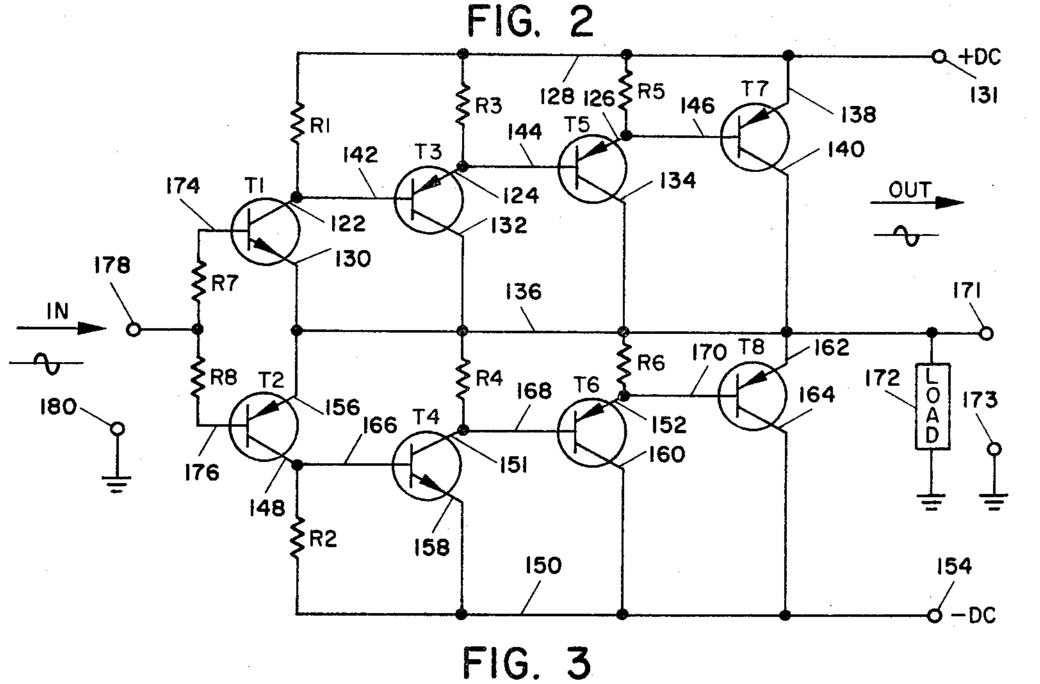
FIGURE 3 is a circuit diagram of an alternate embodiment of the power amplifier of the present invention.

It should be pointed out at this point that the waveforms described hereinafter regarding FIGURES 1–3 are described in open-loop configuration for purposes of clarity and understanding.

*Detail description*

Referring now to the drawings, FIGURE 1 depicts a block diagram of the multistage, high current gain power amplifier of the present invention. The input signal A is delivered to the phase-splitter 10 via input circuit terminals 12 and 14. The phase splitter 10 comprises two output circuit terminals, 16 and 18, upon which negative going signal B and positive going signal C appear, respectively. The signals B and C are delivered to the input circuits of the direct coupled D.C. setters 20 and 22, respectively. The direct coupled D.C. setter 20 is of the type in which there is no phase shift of the output signal D with respect to the input signal B. However, the direct coupled D.C. setter 22 is of the type in which the output signal E is shifted 180° out of phase with respect to the input signal C. The signals D and E which appear on output circuit terminals 24 and 26, respectively, are delivered to direct coupled drivers 28 and 30, respectively. The direct coupled drivers 28 and 30 do not phase shift the output signals F and G with respect to input signals D and E. The signals F and G respectively appear at output circuit terminals 32 and 34 and are respectively delivered to the direct coupled amplifiers 36 and 38. The direct coupled amplifier 36 is of the type in which the output signals therefrom are phase shifted 180° with respect to the input signals applied whereas the direct coupled amplifier 38 does not cause a phase shift. The output signals H and I, which respectively appear at output circuit terminals 40 and 42, are each delivered to the load 44. The signal J is the composite signal being delivered to the load 44 by the direct coupled amplifiers 36 and 38. A 100% closed loop, negative current feedback circuit 46 is connected between the output circuit terminals 40 and 42 of amplifiers 36 and 38, respectively, and the phase splitter 10. This feedback circuit is negative and eliminates substantially all balancing problems with respect to corresponding components in the upper and lower signal paths.

D.C. power sources 48 and 50 provide the operating potentials for the circuit components of the power amplifier. Though FIGURE 1 shows the D.C. sources 48 and 50 respectively connected to the amplifiers 36 and 38, it is to be understood that appropriate D.C. connections may be made between sources 48 and 50 and any circuit element for D.C. operating and biasing purposes. Output circuit terminals 52 and 54 are provided for the purpose of delivering the composite amplified signal J to any subsequent circuit.

In FIGURES 2 and 3, circuit diagrams of the multistage high current gain power amplifier in accordance with the present invention are shown utilizing solid state devices, such as transistors, some of which are connected in complementary symmetry arrangement. By way of example only, the circuits of FIGURES 2 and 3 include transistors, but it is to be understood that other well known solid state devices or semiconductors may be readily substituted without departing from the spirit and scope of this invention. Further, for purpose of clarity the transistors of FIGURES 2 and 3 are respectively referenced $T_1$ to $T_8$ in each figure.

In FIGURE 2, a basic embodiment of the present invention is shown wherein dual signal paths or channels are provided for so called push-push operation. The upper channel comprises transistors $T_1$, $T_3$, $T_5$ and $T_7$ and the lower channel comprises transistors $T_2$, $T_4$, $T_6$ and $T_8$. An input signals $A_2$ is simultaneously delivered to the base electrodes 58 and 60 of transistors $T_1$ and $T_2$, respectively, via input circuit terminals 62 and 64. The transistors $T_1$ and $T_2$, which are N and P types, respectively, constitute what is generally known as a phase splitter. These transistors are connected in a complementary symmetry arrangement so that transistor $T_1$ will conduct only during positive excursions of signal $A_2$ and transistor $T_2$ conducts only during negative excursions of signal $A_2$. The emitter electrodes 66 and 68 of transistors $T_1$ and $T_2$ are each directly connected to the common line 70 in a common emitter circuit arrangement. It will be noted that a 180° phase shift takes place between the positive and negative excursions of signal $A_2$ which respectively drive transistors $T_1$ and $T_2$ into conduction and the respective signals appearing on the collector electrodes 72 and 74 of the transistors $T_1$ and $T_2$, respectively. This phase shift feature is an inherent characteristic of transistors connected in common emitter circuit arrangements. It should also be noted that signals $B_2$ and $C_2$ have voltage swings between +D.C. and reference and −D.C. and reference, respectively. It will be apparent, therefore, that the common emitter configuration of the type described approximately establishes the absolute output voltage level for the power amplifier.

For purposes of clarity regarding circuit connections and operation, the upper and low channels will be described separately.

Transistor $T_1$ has its collector electrode 72 directly connected to the base electrode 76 of the P type transistor $T_3$. The collector electrode 78 of transistor $T_3$ is directly connected to the common line 70 while its emitter electrode 80 is directly connected to the base electrode 82 of the P type transistor $T_5$. Transistor $T_3$ is connected in the circuit in a common collector arrangement. Since it is an inherent characteristic of common collector connected transistors that no appreciable phase shift occurs between the output signal and the input signal, there exists no phase shift between the input signal $B_2$ applied to base electrode 76 and the output signal $D_2$ appearing on the emitter electrode 80. This latter transistor operates in the circuit as a direct coupled D.C. setter. That is to say, transistor $T_3$ is specifically biased and connected in the circuit so as to provide the primary functions of current amplification, establishment of the proper signal phase and establishment of the proper D.C. voltage level for the signal being transferred by the transistor. Thus, in addition to high current amplification and substantially zero phase displacement, the direct coupled D.C. setter $T_3$ also establishes a desired voltage level for signal $D_2$. It will be apparent, therefore, that there exists negative current feedback between the collector 78 of transistor $T_3$ and the emitter 66 of transistor $T_1$ which feedback advantageously reduces the dynamic output impedance of the power amplifier.

The collector electrode 84 of transistor $T_5$ is directly connected to the common line 70 while its emitter electrode 86 is directly connected to the base electrode 88 of the P type transistor $T_7$. Since transistor $T_5$ is also connected in circuit in a common collector arrangement, as mentioned above regarding transistor $T_3$, there is no appreciable phase shift of the output signal $F_2$ with respect to the input signal $D_2$. This latter transistor operates in the circuit as a direct coupled driver. That is to say, transistor $T_5$ is specifically biased and connected in the circuit so as to provide the primary functions of current amplification and phase and voltage level stabilization. It should be noted, at this point, that there also exists a negative current feedback between collector 84 of transistor $T_5$ and the emitter 66 of transistor $T_1$, which feedback further reduces the dynamic output impedance of the power amplifier.

The direct coupled transistor $T_7$ has its collector electrode 90 directly connected to the common line 70 whereas its emitter electrode 92 is directly connected to the positive terminal 94 of a D.C. source of potential. Again, as a result of the negative current feedback that also exists between collector 90 of transistor $T_7$ and the emitter 66 of transistor $T_1$, a still further reduction in the dynamic output impedance of the power amplifier is provided.

This latter transistor is connected in the circuit in a common emitter arrangement and as mentioned above with respect to transistor $T_1$ and $T_2$, it is an inherent characteristic of common emitter connected transistors that a 180° phase shift occurs between input and output signals. Therefore, there exists a 180° phase shift between the output signal $H_2$ and the input signal $F_2$. Thus, the output signal from the upper channel is positive going.

It should be understood, of course, that additional direct coupled driver stages similar to the direct coupled driver $T_5$ and additional direct coupled amplifier stages similar to amplifier $T_7$ may be added to the upper channel if so desired but the last stage of the channel should be connected in the circuit in a manner similar to the circuit connection of amplifier $T_7$ so that the proper phase of the output signal $H_2$ is delivered to the load 96 which is directly connected between common line 70 and reference potential. It is to be also understood that reference potential may be ground under certain requirements. Further, it will be apparent to those skilled in the art that load 96 should have a lower impedance than the input impedance of the amplifier in order to provide the desired current gain.

Referring now to the lower channel circuit of FIGURE 2, transistor $T_2$ has its collector electrode 74 directly connected to the base electrode 98 of the N type transistor $T_4$. The emitter electrode 100 of transistor $T_4$ is directly connected to the common line 102 and its collector electrode 104 is directly connected to the base electrode 106 of the P type transistor $T_6$. The transistor $T_4$ is connected in the circuit in a common emitter arrangement. As mentioned above with regard to transistors $T_1$, $T_2$ and $T_7$, it is an inherent characteristic of common emitter connected transistors that a substantially 180° phase shift occurs between the output and input signals. Thus, there is a 180° phase shift between the input signal $C_2$, which is applied to the base electrode 98, and the output signal $E_2$, which appears on the collector electrode 104. This latter transistor operates in the circuit as a direct coupled D.C. setter much in the same manner as the direct coupled D.C. setter transistor $T_3$ does in the upper channel. Therefore, transistor $T_4$, in addition to the current amplifying and zero phase shifting features also establishes a desired D.C. voltage level for signal $E_2$. It will be noted, therefore, that signal $E_2$ varies between reference and minus D.C. potential, whereas the signal $C_2$ applied to base electrode 98 varies between minus D.C. and reference.

The collector electrode 108 of transistor $T_6$ is directly connected to the common line 102 while its emitter electrode 110 is directly connected to the base electrode 112 of the P type transistor $T_8$. Transistor $T_6$ is connected in the circuit in a common collector arrangement and, as mentioned above regarding transistors $T_3$ and $T_5$, there is no appreciable phase shift of the output signal $G_2$ with respect to the input signal $E_2$. This latter transistor operates in the circuit as a direct coupled driver and is specifically biased and connected so as to provide the primary functions of current amplification and phase and voltage level stabilization. As stated above, when a transistor performs the functions of amplification and phase and voltage level stabilization and its output signals directly drive a directly coupled amplifier, it is commonly referred to as a direct coupled driver.

The collector electrode 114 of transistor $T_8$ is directly connected to the common line 102 whereas its emitter electrode 116 is directly connected to the common line 70. Common line 102 is directly connected to the negative terminal 118 of a D.C. source of potential. Transistor $T_8$ is also connected in a common collector arrangement so that no appreciable phase shift occurs between the output signal $I_2$ and the input signal $G_2$. Thus, the output signal from the lower channel is negative going.

Again, it should be noted, at this point, that there also exists a negative feedback between the emitter 116 of transistor $T_8$ and the emitter 68 of transistor $T_2$, which negative feedback further reduces the dynamic output impedance of the power amplifier.

As above mentioned with respect to the upper channel, additional direct coupled driver and direct coupled amplifier stages may be incorporated in the lower channel but the last stage of this channel should be connected in a manner similar to the circuit connection of the direct coupled amplifier $T_8$ so that the proper phase of the output signal $I_2$ is delivered to the load 96.

It will be noted, at this time, that the output signal $H_2$ of the upper channel comprises the positive excursions of the input signal $A_2$, current amplified and phase and voltage stabilized, whereas the output signal $I_2$ of the lower channel comprises the negative excursions of the input signal $A_2$, also current amplified and phase and voltage stabilized. Therefore, the output signal $J_2$, which is developed across load 96 and deliverable to the output terminals 120 and 121 is a composite of the output signals $H_2$ and $I_2$. Thus, the signal $J_2$ is in effect the input signal $A_2$ current amplified and phase and voltage stabilized.

It will be further noted, that the open loop gain characteristics of the solid state devices in the upper and lower channel are substantially equal to each other. By way of example, the normal gain of each solid state device in the channels is substantially Beta, i.e., the current gain of the device. Therefore, since the channels have the same number of stages and each stage being reasonably chosen for comparable Beta characteristics, the current gain for the positive and negative half cycles of the input signals will be substantially equal.

Referring now to FIGURE 3, there is shown an alternate embodiment of the present invention wherein the output electrodes of the solid state devices are each directly coupled to a D.C. source of potential through compensating resistors for providing a slight forward bias so that slight residual currents will flow through the solid state devices when no input signal is present. The transistors $T_1$–$T_8$ in the embodiment are connected in circuit in substantially the same manner as transistors $T_1$–$T_8$ of FIGURE 2. One basic significant difference between FIGURES 2 and 3 is the utilization of biasing resistors $R_1$–$R_6$.

Resistors $R_1$, $R_3$ and $R_5$ directly connect the collector electrode 122, emitter electrode 124 and emitter electrode 126, respectively, of transistors $T_1$, $T_3$ and $T_5$, respectively, to the common line 128. The positive terminal 131 of a D.C. source of potential is directly connected to common line 128. The emitter electrode 130, collector electrode 132 and collector electrode 134 of transistors $T_1$, $T_3$ and $T_5$, respectively, are directly connected to the common line 136. The direct coupled transistor $T_7$ has its emitter 138 and collector 140 directly connected to common lines 128 and 136, respectively. The collector electrode 122, emitter electrode 124 and emitter electrode 126 of transistors $T_1$, $T_3$ and $T_5$, respectively, are directly connected to the base electrodes 142, 144 and 146, respectively, of transistors $T_3$, $T_5$ and $T_7$, respectively.

It will be apparent that transistors $T_1$, $T_3$, $T_5$ and $T_7$ and resistors $R_1$, $R_3$ and $R_5$ basically make up the upper channel of the dual channel multistage power amplifier o FIGURE 3 and that these transistors operate in this circuit in substantially the same manner as the transistors in the upper channel of FIGURE 2.

Referring now to the lower channel of FIGURE 3, resistor $R_2$ directly connects the collector electrode 148 of transistor $T_2$ to the common line 150 while resistors $R_4$ and $R_6$ directly connect the collector electrode 151 and emitter electrode 152, respectively, of transistors $T_4$ and $T_6$, respectively, to the common line 136. The negative terminal 154 of a D.C. source of potential is directly connected to common line 150. The emitter electrode 156 of transistor $T_2$ is directly connected to the common line 136 while the emitter electrode 158 and collector electrode 160 of transistors $T_4$ and $T_6$, respectively, are directly connected to the common line 150. The direct coupled transistor $T_8$ has its emitter electrode 162 and collector electrode 164 directly connected to the common lines 136 and 150, respectively. The collector electrode 148, collector electrode 151 and emitter electrode 152 of transistors $T_2$, $T_4$ and $T_6$, respectively, are directly connected to the base electrodes 166, 168 and 170, respectively, of transistors $T_4$, $T_6$ and $T_8$, respectively. The output signal is developed across load 172 which is directly connected between the common line 136 and reference potential. The current amplified output signal is therefore available at output terminals 171 and 173.

It will be noted that the lower channel of this latter embodiment basically comprises transistors $T_2$, $T_4$, $T_6$ and $T_8$ and resistors $R_2$, $R_4$ and $R_6$ and that these transistors operate in this circuit in substantially the same manner as the transistors in the lower channel of FIGURE 2.

A second basic significant difference between the power amplifiers depicted in FIGURES 2 and 3 is the utilization of two series connected current limiting resistors, $R_7$ and $R_8$ for substantially preventing "burn out" of the transistors in the power amplifier. That is to say, if transistors $T_1$ and $T_2$ "short out," other transistors in the channels may be damaged as a result of excessive current flow if a current limiting feature is not provided. One method of providing this current limiting safety feature is to respectively connect current limiting resistors directly between the base electrodes and the input circuit such as is depicted in FIGURE 3. It is to be understood, of course, that any well known current limiting or biasing devices may be appropriately incorporated into the circuit for safety purposes.

It should be noted that this point that the unique and advantageous high current amplification and phase and voltage stabilization features above discussed in detail with regard to the embodiment of FIGURE 2 exist in the embodiment of FIGURE 3. Further, the necessary phase shifting of the signal excursions traversing the upper and lower channels and the novel push-push circuit configuration as above discussed in detail with regard to FIGURE 2 are also provided in the embodiment of FIGURE 3. In addition, the 100% closed loop negative current feedback feature of the present invention is provided by the unique direct coupled circuitry between the load 172 and the common emitter connected transistors $T_1$ and $T_2$. Still further, the waveforms $A_2$–$J_2$ specifically delineated in FIGURE 2 are substantially the same at respective points in the power amplifier circuit of FIGURE 3.

In this connection, the negative current feedback paths of transistors $T_3$, $T_5$, $T_7$ and $T_8$ of FIGURE 3 are substantially the same as the above described negative current feedback paths of transistors $T_3$, $T_5$, $T_7$ and $T_8$ of FIGURE 2. These negative current feedback paths advantageously reduce the dynamic output impedance of the power amplifier as depicted in FIGURE 3.

A third basic significant difference between the power amplifiers depicted in FIGURES 2 and 3 is the inclusion of two additional negative current feedback paths. The first of these feedback paths being from collector 151 of transistor $T_4$ through resistor $R_4$ and common line 136 to emitter 156 of transistor $T_2$ and the other feedback path being from emitter 152 of transistor $T_6$ through resistor $R_6$ and common line 136 to emitter 156 of transistor $T_2$. As will be apparent, these additional negative current feedback paths further reduce the dynamic output impedance of the power amplifier.

With regard to the power amplifiers as depicted in FIGURES 2 and 3, the D.C. driver transistors $T_5$ and $T_6$ of each may be omitted under certain circuit requirements. Of course, when these transistor stages are removed from the amplifier the degree of stability, distortion, dynamic output impedance, and power gain will be considerably affected. However, although the omission of the direct coupled driver stages provides a power amplifier superior in overall requirements to any prior known power amplifier, the four stage, dual channel, power amplifiers as shown in FIGURES 2 and 3 are preferred. Also, current limiting and biasing diodes may be series connected in the emitter circuits of transistors $T_7$ and $T_8$ for protecting these transistors in the event that an excessively low resistive load is used or if the load used is "shorted out." Clearly, if the load of the power amplifier were to "short out" or too low a resistance load applied, excessively high currents would flow through direct coupled transistors $T_7$ and $T_8$. However, if heavy rated diodes are used in series with the emitter-collector circuits of transistors $T_7$ and $T_8$, an increased voltage drop across the diodes will exist if there occurs abnormally high current flow in these circuit paths. This increased voltage drop advantageously adds degeneratively to the bias on the base electrodes of the transistors $T_7$ and $T_8$ so as to reduce current conduction in the transistors to a safe level. It is to be understood, of course, that although the use of diodes in the emitter circuits of transistors $T_7$ and $T_8$ will disadvantageously increase dynamic output impedance and the total developed output distortion, the circuit requirements in some instances may warrant this increased transistor protection at the expense of increased output impedance and distortion.

*Mode of operation*

The operation of the high current gain power amplifier as depicted in FIGURE 2 is as follows:

With no input signal $A_2$ present, the transistors $T_1$–$T_8$ are normally nonconducting. Thus, there exists substantially no current flow in the emitter-base, emitter-collector or base-collector paths of the transistors $T_1$–$T_8$.

With input signal $A_2$ present, the positive excursions of this signal will drive transistor $T_1$ into conduction and drive transistor $T_2$ into its normally nonconducting state. As a result of the current conduction in transistor $T_1$, the voltage on its collector 72 sufficiently drops from +D.C. toward reference so as to drive transistor $T_3$ into conduction. A similar voltage drop occurs on emitter 80 so as to drive transistor $T_5$ into conduction which in turn causes a voltage drop on emitter 86 of that transistor so as to drive transistor $T_7$ into conduction. It is to be understood, of course, that each of the transistors $T_1$, $T_3$, $T_5$ and $T_7$ switch from their normally nonconducting states to their conducting states substantially instantaneously so that the upper channel will provide high current gain and voltage and phase stabilization with basically no signal distortion over a wide range of input signal frequencies. Thus, a highly amplified, phase and voltage stabilized, distortionless, positive swinging signal will be delivered to the load 96 during the positive excursions of input signal $A_2$.

With input signal $A_2$ present, the negative excursions of this signal will drive transistor $T_2$ into conduction and drive transistor $T_1$ into its normally nonconducting state. As a result of the current conduction in transistor $T_2$, the voltage on its collector 74 sufficiently rises from —D.C. toward reference so as to drive transistor $T_4$ into conduction. A sufficient voltage drop then occurs on collector 104 so as to drive transistor $T_6$ into conduction which in turn causes a voltage drop on emitter 110 of that transistor so as to drive transistor $T_8$ into conduction. As mentioned above with respect to the upper channel, each of the transistors $T_2$, $T_4$, $T_6$ and $T_8$ instantaneously switch from their normally nonconducting states to their conducting states. Thus, a highly current amplified, phase and voltage stabilized, distortionless, negative swinging signal will be delivered to the load 96 during the negative excursions of input signal $A_2$.

It will be readily apparent from the foregoing that a first portion of input signal $A_2$, which drives the upper channel of the circuit, will be delivered to and developed across load 96, then, a second portion of signal $A_2$, which drives the lower channel of the circuit, will be delivered to and developed across load 96. Accordingly, since load 96 is connected between common line 70 and reference, the output signal $J_2$ is developed in what is generally referred to as a push-push output operation. The path and direction of current flow through load 96 when direct coupled amplifier $T_7$ is conducting comprises plus D.C. source, terminal 94, emitter 92, collector 90, common line 70, load 96, reference, back to plus D.C. source whereas the path and direction of current flow through load 96 when direct coupled amplifier $T_8$ is conducting comprises reference, load 96, common line 70, emitter 116, collector 14, common line 102, terminal 118, minus D.C. source, back to reference. The appropriate polarity signs representing the flow of currents through load 96 are shown at the upper and lower ends of load 96.

The operation of the high current gain power amplifier as depicted in FIGURE 3 is as follows:

With no input signal present, the transistors $T_1$ and $T_2$ are biased into a normally non-conducting state. However, since transistors $T_3$–$T_8$ are forward biased, there exists a slight residual current flow so that these transistors have a normally low conducting state (i.e., due to the leakage resistance of the transistors and the resistors $R_1$–$R_6$). This, of course, differs from the normal conditions of transistors $T_3$–$T_8$ as above discussed with regard to the mode of operation of the circuit of FIGURE 2 since the corresponding transistors in this latter circuit have a normally non-conducting state in the absence of an input signal.

With an input signal present, the positive excursions of this signal will drive transistor $T_1$ into conduction and drive transistor $T_2$ into its normally non-conducting state. As a result of the current conduction of transistor $T_1$, the voltage on its collector 122 sufficiently drops from the plus D.C. toward reference so as to drive transistor $T_3$ into its high conducting state. A similar voltage drop occurs on emitter 124 so as to drive transistor $T_5$ into its high conducting state which, in turn, causes a voltage drop on the emitter 126 of that transistor so as to drive transistor $T_7$ into its high conducting state. It is to be understood of course that transistor $T_1$ switches from its non-conducting state, and transistors $T_3$, $T_5$ and $T_7$ switch from their normally low conducting state to their high conducting states substantially instantaneously so that the upper channel will provide high current gain and voltage and phase stabilization with basically no signal distortion over a wide range of input signal frequencies. Thus, a high current amplified, phase and voltage stabilized, distortionless, positive swinging signal, will be delivered to the load 172 during the positive excursions of the input signal.

With an input signal present, the negative excursions of this signal will drive transistor $T_2$ into conduction and drive transistor $T_1$ into a non-conducting state. As a result of the current conduction in transistor $T_2$, the voltage on its collector 148 sufficiently rises from minus D.C. toward reference so as to drive transistor $T_4$ into its high conducting state. A sufficient voltage drop then occurs on collector 151 so as to drive transistor $T_6$ into its high conducting state, which in turn causes a voltage drop on emitter 152 of that transistor so as to drive transistor $T_8$ into its high conducting state. As mentioned above with respect to the upper channel, the transistor $T_2$ is driven into its conductive state and transistors $T_4$, $T_6$, and $T_8$ are driven into their high conducting states substantially instantaneously. Thus, a high current amplified, phase and voltage stabilized, distortionless, negative swinging signal, will be delivered to the load 172 during the negative excursions of the input signal.

It will be readily apparent from the foregoing description of the mode of operation of FIGURE 3 that a first portion of the input signal applied to the circuit, which drives the upper channel of the circuit, will be delivered to and developed across load 172, then, a second portion of the signal, which drives the lower channel of the circuit, will be delivered to and developed across load 172. Accordingly, since load 172 is connected between common line 136 and references, the output signal is developed in what is commonly referred to as a push-push output operation. The path and direction of current flow through load 172 when direct coupled amplifier $T_7$ is conducting comprises plus D.C. source, terminal 131, emitter 138, collector 140, common line 136, load 172, reference and back to plus D.C. source. Whereas, the path and direction of current flow through load 172 when direct coupled amplifier $T_8$ is conducting comprises reference, load 172, common line 136, emitter 162, collector 164, common line 150, terminal 154, minus D.C. source and back to reference. The appropriate polarity signs representing the flow of currents through load 172 are shown at the upper and lower ends of load 172.

For exemplary purposes only, the following components and performance data are included, reference being made to the power amplifier of FIGURE 3.

*List of elements*

| | |
|---|---|
| $T_1$—2 **388** | $R_1$—11,000 Ohms |
| $T_2$—2 **396** | $R_2$—11,000 Ohms |
| $T_3$—2 **396** | $R_3$—1,000 Ohms |
| $T_4$—2 **388** | $R_4$—1,000 Ohms |
| $T_5$—2 **665** | $R_5$—2.7 Ohms |
| $T_6$—2 **665** | $R_6$—2.7 Ohms |
| $T_7$—2 **174** | $R_7$—10,000 Ohms |
| $T_8$—2 **174** | $R_8$—10,000 Ohms |

*Performance data*

| | |
|---|---|
| (1) Dynamic output impedance, ohms | 0.045 |
| (2) Total developed output distortion, percent | 0.1 |
| (3) Current gain @ 5.0 amps R.M.S. output current level | 356,000 |
| (4) Actual voltage gain | 0.99 |
| (5) Power gain @ 5.0 amps R.M.S. output current level | 352,000 |
| (6) Input impedance, ohms | 485,000 |
| (7) Phase shift (too low to measure), degrees | 0 |

NOTE: Above data conducted on 400 c.p.s. with a 6.8 volt R.M.S. input signal.

In view of the foregoing detailed description and mode of operation, it will be apparent that the present invention provides a novel high current gain and unity voltage gain power amplifier which effectively utilizes a complementary arrangement of solid state devices some of which are connected in complementary symmetry configurations and uniquely permits so called push-push operation. The elimination of inductive or transformer coupling materially improves quality of performance and substantially reduces manufacturing costs. In addition, the employing of non-linear resistive means for forward biasing the solid state devices of the power amplifier materially improves static balance, controls static bias and minimizes tendency of "thermal runaway." Further, the inclusion of a 100% closed loop negative current feedback circuit uniquely eliminates the burdensome and costly necessity of signal channel balancing and permits the use of solid state devices having a wide variety of static and dynamic characteristics. Still further, the novel direct coupled, high current gain, unity voltage gain, multistage, dual channel, transformerless, power amplifier of the present invention which effectively utilizes solid state devices in complementary and complementary symmetry arrangements, provides high stability, low distortion, low dynamic output impedance, wide frequency range and high current power output capability, while retaining unity voltage gain.

It is thus further seen that the multistage power amplifier of the present invention achieves the acme of simplicity, is economical to manufacture and highly reliable in performing the desired objects and intended functions.

While several embodiments of the present invention have been described in detail, it is to be understood that other modifications are contemplated which would be apparent to persons skilled in the art without departing from the spirit of the invention or the scope of the appended claims.

We claim:

1. A high current gain, unity voltage gain power amplifier, the combination comprising a phase-splitter having two output circuits, input circuit means for simultaneously delivering signals to said phase-splitter, first and second signal channels for current amplifying and voltage and phase stabilizing of at least a portion of said signals, with each channel having input and output circuits, said output circuits of said phase-splitter being respectively connected to said input circuits of said first and second channels, means providing substantially 100% negative current feedback from said output circuits of said first and second channels to said phase splitter, load impedance means connected in common to said output circuits of said first and second channels, said first channel coupling a first portion of the input signal to said load for developing a first portion of the output signal and said second channel coupling a second portion of the input signal to said load for developing a second portion of the output signal, and D.C. means for providing operating potentials for said power amplifier.

2. A high current gain, unity voltage gain power amplifier in accordance with claim 1 wherein said phase-splitter comprises first and second solid state devices connected in complementary symmetry with said first device being of one conductivity and said second device being of opposite conductivity.

3. A high current gain, unity voltage gain power amplifier in accordance with claim 2 wherein said first and second channels each comprise at least two series connected solid state devices, with the first of said devices in said second channel being of said opposite conductivity and the remaining devices in both of said channels being of said one conductivity.

4. A high current gain, unity voltage gain power amplifier in accordance with claim 2 wherein said first and second channels each comprise a direct coupled D.C. setter, direct coupled driver and direct coupled amplifier.

5. A high current gain, unity voltage gain power amplifier in accordance with claim 5 wherein said setter, driver and amplifier in said first channel and said driver and amplifier in said second channel are solid state devices of said opposite conductivity, and said setter in said second channel is a solid state device of said one conductivity.

6. A high current gain, unity voltage gain power amplifier in accordance with claim 5 wherein said solid state devices have input, output and common electrodes, and the said feedback means circuit directly connects said load to (1) said common electrodes of said setter and driver in said first channel, (2) said output electrode of said amplifier in said first channel, (3) said common electrodes of said first and second devices of said phase-splitter, and (4) said output electrode of said amplifier in said second channel.

7. A high current gain, unity voltage gain power amplifier in accordance with claim 6 wherein said D.C. means has positive and negative terminals one of which is directly connected to said common electrode of said amplifier in said first channel and the other of which is directly connected to said common electrodes of said setter, driver and amplifier in said second channel.

8. A high current gain, unity voltage gain power amplifier in accordance with claim 7 wherein said solid state devices of said channels are forward biased so that a slight residual current will flow through said devices when no input signal is being applied to said phase-splitter.

9. A high current gain, unity voltage gain power amplifier in accordance with claim 8 wherein said solid state devices of said first and second channels are forward biased by directly coupling their input electrodes to a D.C. source of potential through D.C. coupling means for improving static balance in said multistage power amplifier and for controlling static bias by providing a D.C. clamping action on each stage of said multistage power amplifier.

10. A high current gain, unity voltage gain power amplifier in accordance with claim 9 wherein said D.C. coupling means are resistors.

11. A high current gain, unity voltage gain power amplifier in accordance with claim 10 wherein said power amplifier further includes current limiting means series connected between said input circuit means and said input electrodes of said first and second devices of said phase splitter for preventing burn out of said devices of said power amplifier in the event of reverse current breakdown.

12. A high current gain, unity voltage gain power amplifier in accordance with claim 11 wherein said current limiting means are resistors.

13. A multistage power amplifier comprising the combination of a first pair of complementary solid state devices each device having input and output means, input circuit means for simultaneously coupling an input signal to said input means of said first pair of devices, a second pair of complementary solid state devices each device having input and output means, one of said devices in each of said first and second pairs being of one conductivity type and the other device in each of said first and second pairs being of an opposite conductivity type, said output means of said one device of said one conductivity of said first pair being directly connected to said input means of said other device of said opposite conductivity of said second pair, said output means of said other device of said opposite conductivity of said first pair being directly connected to said input means of said one device of said one conductivity of said second pair, first and second signal channels each channel having at least one solid state device of said one conductivity with each channel having input and output means, said output means of said other device of said opposite conductivity of said second pair, and said output means of said one device of said one conductivity of said second pair being directly connected to said input means of said first and second channels, respectively, load impedance means connected in common to said output means of said channels and to said first pair of devices to provide substantially 100% negative current feedback thereto, and a power source for biasing all of said solid state devices of said power amplifier.

14. A multistage power amplifier having a high current gain and unity voltage gain, the combination comprising, first and fourth solid state devices of one conductivity each having input, output and common electrodes, second and third solid state devices of opposite conductivity each having input, output and common electrodes, input circuit means for simultaneously applying an input signal to said input electrodes of said first and second devices, said output electrodes of said first and second devices being directly connected to said input electrodes of said third and fourth devices, respectively, load impedance means, output means for respectively coupling the signals appearing on said output electrodes of said third and fourth devices to said load, a substantially 100% negative current feedback loop direct coupled between said output means and the common electrodes of said first and second devices, D.C. power means for biasing said devices, and D.C. coupling means for coupling operating potentials to said solid state devices from said power means.

15. A multistage power amplifier in accordance with claim 14 wherein said output means includes fifth and sixth solid state devices of said opposite conductivity each having input, output and common electrodes, said output electrodes of said third and fourth devices being directly connected to said input terminals of said fifth and sixth devices, respectively.

16. A multistage power amplifier in accordance with claim 15 wherein said D.C. power means forward biases said solid state devices so that a slight residual current flows through all of said devices when no input signal is applied.

17. A multistage power amplifier in accordance with claim 16 wherein said solid state devices are forward biased by directly coupling their output electrodes to said D.C. power means through resistive means for improving static balance in said multistage power amplifier and for controlling static bias by providing a D.C. clamping action in each stage of said multistage power amplifier.

18. A multistage power amplifier having a high current gain and unity voltage gain, the combination comprising, a first solid state device of one conductivity having input, output and common electrodes, a second solid state device of opposite conductivity having input, output and common electrodes, input circuit means for simultaneously applying an input signal to said input electrodes of said first and second devices, a third solid state device of said opposite conductivity having input, output and common electrodes, said output electrode of said first device being directly connected to said input electrode of said third device, a fourth solid state device of said one conductivity having input, output and common electrodes, said output electrode of said second device being directly connected to said input electrode of said fourth device, a first chain of at least two cascaded solid state devices of said opposite conductivity each device having input, output and common electrodes, means directly connecting said output electrode of said third device to the input electrode of the first device in said first chain to provide substantially 100% negative current feedback, a second chain of at least two solid state devices of said opposite conductivity each device having input, output and common electrodes, said output electrode of said fourth device being directly connected to the input electrode of the first device in said second chain, load impedance means having first and second terminals, said first terminal of said load being directly connected to (1) the common electrodes of the said first, second, and third devices, (2) the common electrodes of each device in said first chain which precedes said last device in said first chain, and (3) the output electrodes of the last device in both of said first and second chains, a reference potential, said second terminal of said load being directly connected to said reference potential, a D.C. power source having positive and negative terminals, said positive terminal being directly connected to the common electrode of the last device in said first chain, and said negative terminal being directly connected to (1) the common electrode of said fourth device, and (2) the common electrodes of each device in said second chain.

19. A multistage direct coupled power amplifier having high current gain and unity voltage gain, the combination comprising a first transistor of one conductivity having base, collector and emitter electrodes, a second transistor of opposite conductivity having a base, collector and emitter electrodes, input circuit means for simultaneously applying an input signal to said base electrodes of said first and second transistors, a third transistor of said opposite conductivity having base, collector and emitter electrodes, said collector electrode of said first transistor being directly connected to said base electrode of said third transistor, a fourth transistor of said one conductivity having base, collector and emitter electrodes, said collector electrode of said second transistor being directly connected to said base electrode of said fourth transistor, a first chain of at least two cascaded transistors of said opposite conductivity, each transistor having base, collector and emitter electrodes, said emitter electrode of said third transistor being directly connected to the base electrode of the first transistor in said first chain, a second chain of at least two transistors of said opposite conductivity, each transistor having base, collector and emitter electrodes, said collector electrode of said fourth transistor being directly connected to the base electrode of the first transistor in said second chain, load impedance means having first and second terminals, said first terminal of said load being directly connected to (1) the emitter electrodes of said first and second transistors, (2) the collector electrode of said third transistor, (3) the collector electrodes of each transistor in said first chain, and (4) the emitter electrode of the last transistor in said second chain, a reference potential, said second terminal of said load being directly connected to said reference potential, a D.C. power source having positive and negative terminals, said positive terminal being connected to the emitter electrode of the last transistor in said first chain, and said negative terminal being connected to (1) the emitter electrode of said fourth transistor, and (2) the collector electrodes of each transistor in said second chain.

References Cited by the Applicant

UNITED STATES PATENTS

| | | | |
|---|---|---|---|
| 2,860,193 | 11/1958 | Lindsay | 330—17 X |
| 2,887,540 | 5/1959 | Aronson | 330—23 X |
| 3,042,875 | 7/1962 | Higginbotham | 330—17 |
| 3,195,064 | 7/1965 | Offner | 330—17 X |

OTHER REFERENCES

Inverse Feedback, John F. Rider, Publisher, Inc., New York, 1956, E-T Series No. 166–15, pages 9, 10, 11, 13, 14, 16, 17, 18, 44. (TK-7835-S33-C.3).

ROY LAKE, *Primary Examiner.*

NATHAN KAUFMAN, *Examiner.*

F. D. PARIS, *Assistant Examiner.*